United States Patent [19]

Bestel et al.

[11] 4,033,833
[45] July 5, 1977

[54] METHOD OF SELECTIVELY ELECTROPLATING AN AREA OF A SURFACE

[75] Inventors: John Louis Bestel, Montgomery Township, Somerset County; Richard Haynes, East Windsor Township, Mercer County, both of N.J.; Venkataraman Srinivasan, Attleboro, Mass.

[73] Assignee: Western Electric Company, Inc., New York, N.Y.

[22] Filed: July 8, 1976

[21] Appl. No.: 703,326

Related U.S. Application Data

[63] Continuation-in-part of Ser. No. 627,317, Oct. 30, 1975, abandoned.

[52] U.S. Cl. .................... 204/15; 204/224 R; 204/DIG. 7
[51] Int. Cl.² .................. C25D 5/02; C25D 5/08
[58] Field of Search ............. 204/15, DIG. 7, 224 R

[56] References Cited

UNITED STATES PATENTS

| | | | |
|---|---|---|---|
| 2,750,332 | 6/1956 | Miller | 204/15 |
| 2,828,255 | 3/1958 | Gempe | 204/199 |
| 2,854,387 | 9/1958 | Zimmerman | 204/15 |
| 2,873,232 | 2/1959 | Zimmerman | 204/15 |
| 2,945,789 | 7/1960 | Williams | 204/15 |
| 3,137,645 | 6/1964 | Vaughan et al. | 204/206 |
| 3,334,028 | 8/1967 | Polichette | 204/15 |
| 3,692,639 | 9/1972 | Delmousos | 204/28 |
| 3,723,283 | 3/1973 | Johnson et al. | 204/206 |
| 3,788,963 | 1/1974 | Kosowsky et al. | 204/206 |
| 3,810,829 | 5/1974 | Fletcher | 204/222 |
| 3,814,117 | 6/1974 | Rackus et al. | 204/15 |
| 3,891,534 | 6/1975 | Cordone et al. | 204/272 |
| 3,894,918 | 7/1975 | Corby et al. | 204/15 |
| 3,897,323 | 7/1975 | Schlotthauer | 204/224 R |
| Re. 28,267 | 12/1974 | Rackus et al. | 204/15 |

FOREIGN PATENTS OR APPLICATIONS

| | | |
|---|---|---|
| 577,747 | 6/1933 | Germany |
| 850,972 | 5/1952 | Germany |
| 986 | 1896 | United Kingdom |
| 775,359 | 5/1957 | United Kingdom |
| 1,396,342 | 6/1975 | United Kingdom |

OTHER PUBLICATIONS

Metal Finishing, Mar. 1961, pp. 57-63.

*Primary Examiner*—T. M. Tufariello
*Attorney, Agent, or Firm*—J. Rosenstock

[57] ABSTRACT

A method of selectively plating an area of a substrate surface is disclosed. The method comprises contact masking at least one charged anode, spaced from the surface, with a dielectric member which is maintained between the anode and the surface, along their corresponding opposed surface areas, out of contact with the surface. The surface is cathodically charged. The masked anode is contacted with a stream of an electroplating electrolyte. The stream of electrolyte then contacts at least a portion of the charged surface, including the area to be plated, to fully flow electrolyte thereover to selectively electroplate the area.

8 Claims, 9 Drawing Figures

METHOD OF SELECTIVELY ELECTROPLATING AN AREA OF A SURFACE

CROSS REFERENCE TO RELATED APPLICATION

This is a continuation-in-part of my abandoned co-pending application, Ser. No. 627,317, filed Oct. 30, 1975. Said copending application is assigned to the same assignee as the instant application.

BACKGROUND OF THE INVENTION

1. Field of the Invention

This invention relates to a method of selectively plating an area of a substrate surface and more particularly, to a method including the use of a dielectric member contact masking an anode.

2. Description of the Prior Art

Over the years, many systems and methods were developed for plating patterns of metal on metal or other substrates. Some techniques include masking of the substrate to produce the desired pattern or confining the electroplating electrolyte to discrete portions of the substrate. The elimination of this particular masking or confining requirement would contribute greatly to the advancement of the art since such masking increases the complexity and cost of the process. Such an elimination of masks is especially desirable in the manufacture of integrated circuits where selective or spot plating is essential in order to eliminate the waste of precious metals such as gold.

In the manufacture of integrated circuits, leads of each of a plurality of integrated circuit chips are bonded individually to gold conductive patterns formed on insulating ceramic substrates. In order to connect these patterns to other circuits, leads are connected to these patterns and are often formed from a lead frame stamped from a sheet of conductive metal such as nickel, copper or the like. The lead frame has a separate group of leads for each conductive pattern of each substrate, and these leads are bonded to the substrate. Each group has the outer ends of each lead interconnected to carrier strips and their opposed inner free ends bonded to the conductive pattern of each substrate. The leads are also interconnected intermediate their ends by relatively narrow support strips. The carrier strips have outer portions perforated for feeding them through various treating operations. Both the carrier and support strips are severed to separate the individual leads prior to the completion of the ultimate integrated circuits.

In the prior art techniques, a layer of gold has been often formed over the entire lead frame by electroless or electroplating. The purpose of such a gold layer is to improve any bonds made to the lead frame. In other prior art techniques, a non-uniform layer of gold has been formed over the entire lead frame with the greatest thickness being concentrated at those portions of the frame where the bonding of an integrated circuit chip or other semiconductive device is to take place (see Rackus et al., U.S. Pat. No. 3,692,638). Since the carrier and support strips are ultimately trimmed away it is desirable to have no gold on them. Since the substrates are bonded to the inner free ends of the leads, it is desirable to have a gold layer thereon to improve bondability. Since no substrates are bonded to the remainder of the leads, a gold layer thereon is not necessary. The absence of gold on these strips eliminates expensive and time-consuming reclamation processes to recover the gold from these strips. The absence of gold everywhere except where substrate bonding is to take place can result in a very desirable efficient use and substantial savings of gold. It is desirable to bring about selective or spot plating without the use of substrate (lead frame) masks. The elimination of such masks often simplifies the treating process and eliminates any mask replacement or cleaning steps.

Selective plating enhancement techniques are known in the art in which discrete areas of a surface are electroplated at a much greater or enhanced rate than other areas which are simultaneously being plated. U.S. Pat. No. 2,828,255; British Pat. No. 775,359; German Pat. No. 577,747; and German Pat. No. 850,972 contain typical examples of such techniques. However, as shown in the above patents, the surface being plated is immersed in electroplating electrolyte and is consequently essentially immediately blanket electroplated rather than being selectively electroplated. It is desirable to obtain selective electroplating on discrete areas of a surface in a practical, workable thickness, e.g., typically 100µ inches, without electroplating on areas adjacent thereto. This is a requirement which is not readily feasible by immersion of the entire surface (unmasked) in the electroplating electrolyte.

SUMMARY OF THE INVENTION

This invention relates to a method of selectively plating an area of a substrate surface and more particularly, to a method including the use of a dielectric member contact masking an anode.

The method comprises contact masking at least one charged anode electrode spaced from the surface with a dielectric member which is maintained between the charged anode and the surface, along their corresponding opposed surface areas, out of contact with the surface. The surface is cathodically charged. The masked anode is contacted with a stream of electroplating electrolyte and at least a portion of the surface is contacted with electrolyte only from the electrolyte stream to distribute the electrolyte over at least the portion of the surface, including the area to be plated, to freely flow electrolyte thereover, to selectively electroplate the area.

DESCRIPTION OF THE DRAWING

The present invention will be more readily understood by reference to the following drawing taken in conjunction with the detailed description, wherein.

DETAILED DESCRIPTION

The present invention has been described largely in terms of electroplating gold on a curved connector member and on selected areas of an integrated circuit beam-lead frame, where electroplating solution can either flow through adjacent areas or be blocked thereby. However, it will be understood that such description is for purposes of exposition and not for purposes of limitation. It will be readily appreciated that the inventive concept described is equally applicable to selectively coating any conductive area with any plateable metal, e.g., Cu, Pt, Ag, Ni, etc., with a deposit having any shape or configuration, e.g., spots, lines, rectangles, etc., regardless of whether electroplating solution can flow through the area or substrate to be plated.

Figure 1:
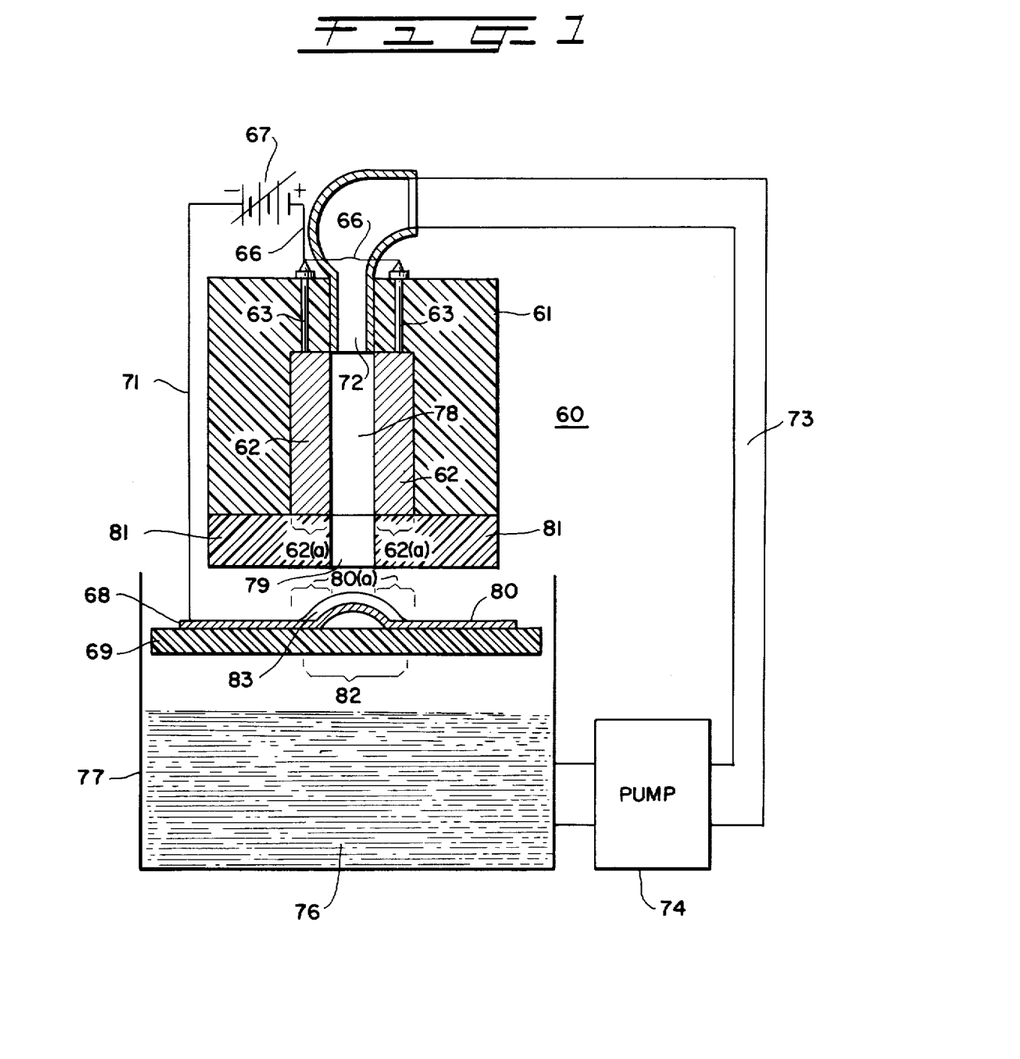
FIG. 1 is a schematic view of an electroplating system according to the invention.

As seen in FIG. 1, the plating system according to the invention includes a plating head generally indicated at 60 comprising an electrically insulating housing 61 comprising a dielectric material, e.g., polytetrafluoroethylene, polyvinyl chloride, a polyimide, a polymethylacrylate, polypropylene, glass-filled polytetrafluoroethylene, etc. Housing 61 contains at least one anode 62, illustratively a plurality of rectangular plate anodes. Anodes 62 may comprise any suitable non-corrosive conductive material, e.g., platinum, platinum-clad titanium, platinum clad tantalum, gold-plated nickel steel, etc. Anodes 62 are supported within and affixed to housing 61 by means of electrically conductive member 63, e.g., bolts or any other suitable means which are threaded at one end and affixed to housing 61 by any conventional affixing means capable of receiving threaded members such as wing nuts, etc. Electrical contact to anodes 62 is made through conductive member 63 by means of electrical conductor 66 connected to the positive side of an electrical source 67, e.g., a constant current or voltage supply (DC) which may be pulsed if desired. An electrically conductive substrate 68, destined to be selectively electroplated, is supported by a support member 69, e.g., a dielectric base, and is electrically connected to the negative side of electrical source 67 by an electrical conductor 71. Substrate 68 is thereby cathodically charged to a desired potential. It is of course to be understood that conductive substrate 68 can be supported on a conductive supporting member 69 which functions as a cathode, where member 69 is directly electrically connected to the negative side of source 67 by any conventional means, e.g., a conductor line. Also, it is to be understood that conductor 71 may be affixed to and pass through housing 61.

Housing 61 constitutes a component of an electrolyte distributing system which illustratively includes an electrolyte inlet 72 supplied by a feed line 73 which is connected to a conventional pump 74, e.g., a centrifugal pump. A suitable electroplating electrolyte 76, e.g., a potassium gold cyanide containing solution, is contained in a reservoir 77 out of contact with substrate 68. Typical suitable precious metal electroplating electrolytes (solutions) include aqueous solutions containing a gold cyanide complex ion based on potassium gold cyanide. Other plating solutions for precious metals, e.g., Pt, Pd, etc., as well as other metals, e.g., Ni, Cu, etc., are described in a book edited by F. A. Lowenheim, *Modern Electroplating*, John Wiley & Sons, New York, 3rd Edition, 1974. Electrolyte 76 is pumped from reservior 77 by pump 74 through feed line 73 and into inlet 72. Electrolyte 76 injected at inlet 72 traverses a path through a channel 78, whose walls are defined by anodes 62, communicating at one end with inlet 72 and at its opposite end with a channel or outlet 79 defined by a dielectric masking member 81 which contacts and masks anodes 62. After leaving outlet channel 79, electrolyte 76 traverses a region which includes cathodically charged substrate 68. Electrolyte 76 is then collected in reservoir 77. It is to be noted that where inlet 72 and/or channel 78 is of a different configuration than outlet channel 79, e.g., circular as compared to rectangular, a conventional flow distribution means (not shown) may be employed to uniformly distribute electrolyte flow between the channels (78, 79).

Maintained between anodes 62 and cathodically charged substrate 68 along their entire respective surfaces [opposed surfaces, i.e., anode surface 62 (*a*) and surface portions 80 (*a*) of surface 80 of substrate 68], but out of contact with substrate 68, is dielectric member 81 which contact masks anodes 62. Member 81 comprises any suitable electrically insulating material including organic polymers, glass, ceramic, etc. Member 81 is affixed to housing 61 and/or anodes 62 by any conventional means, including adhesive means. It is of course to be understood that dielectric member 81 may be an integral part of housing 61 or may comprise any separate member affixed to or masking anodes 62. In this regard, it is to be pointed out and stressed that dielectric member 81 may be of any configuration depending upon what electrodeposit configuration and thickness is desired on substrate 68. Member 81 masks anodes 62 in a desired fashion as well as defines channel 79 in a desired fashion. In this regard, reference is made to FIG. 2 where, illustratively, masking member 81 defines a rectangular channel 79. It is to be pointed out and stressed hereat that channel 79 may be defined in any desired shape, e.g., rectangular, circular, square, rhomboidal, trapezoidal etc., and need not conform in size or shape to the area to be electroplated. It is also to be pointed out that there may be employed a single anode and a single masking member or a plurality of each whereby a single or a plurality of outlet channels are formed which may be defined in part by the anode or anodes. It is further to be pointed out that the outlet channel or channels may have a variable orientation with respect to a cathodically charged surface and that if a plurality of anodes are employed thay may each be of a different shape and orientation with respect to the resultant outlet channel.

Referring back to FIG. 1, the dielectric contact masking of anodes 62 by member 81 is extremely important for electroplating a selected area of surface 80 of substrate 68 without masking surface 80. A desired electroplated shape and thickness may be attained with a free flowing stream of electrolyte over at least a portion of surface 80 of substrate 68, including the area destined to be electroplated, illustratively the curved surface area 82. However, by contact masking anodes 62 with dielectric member 81 in a different fashion or configuration, it is possible to electroplate in the form of spots, lines, rectangles, etc., without masking surface 80 of cathodically charged substrate 68. It is to be stressed, however, that it is critical that masking member 81 contact anodes 62 along each surface thereof opposed to the surface of the substrate destined to be selectively electroplated. If such is not done, selective electrodeposition in a desired configuration cannot be achieved without first masking the surface being electroplated.

In operation, pump 74 is activated producing a continuous flowing stream of electrolyte 76 which is injected at inlet 72 and enters channel 78, whereat the electrolyte stream contacts anodes 62, which are maintained at a desired electrical potential by source 67, e.g., typically 3 to 4 volts for plating Au from a potassium gold cyanide solution. The electrolyte stream passes through channel 78 and through outlet channel 79 and impinges on or is distributed over surface 80 of substrate 68, including area 82 destined to be electroplated, in the form of a free flowing stream of electrolyte, i.e., a stream of electrolyte which is not confined to any boundaries on surface 80 of substrate 68. Substrate 68 is cathodically charged to a desired electrical potential, e.g., typically 3 to 4 volts for plating gold from a potassium gold cyanide solution, whereby an electric plating field is established between anodes 62 and surface 80 of the cathodically charged substrate, through the distributed free flowing stream of electrolyte. The stream of electrolyte contacting charged anodes 62 and charged surface 80 becomes charged and a current is passed therethrough whereby a current density is established within the free flowing stream of electrolyte which is sufficient for electroplating to occur on surface 80 of substrate 68.

If masking member 81 were not present, plating would occur over surface 80 of substrate 68 and not be restricted to surface area 82 thereof. However, at a fixed flow rate, current density, anode-to-cathode distance, the selective contact masking of anodes 62 with member 81 controls the flow rate distribution of the distributed free flowing stream of electrolyte over at least area 82 and localizes the electric plating field to area 82 whereby plating of a desired thickness profile is obtained thereon. In other words member 81 or controls (1) the current density by lengthening or screening the current lines of force from anode 62 to surface 80 of charged substrate 68, (2) the flow rate distribution of the free flowing stream of electrolyte, i.e., the rate of flow impinging on different areas of substrate surface 80 at the same time (different rates at different areas at a particular time period), and in some cases (3) the actual electrolyte discontinuity. The term "electrolyte discontinuity" means that contact of electrolyte 76 in the free flowing stream is absent on areas of surface 80. Through this control by member 81, the electric field, created by the difference in potential between anodes 62 and surface 80, is localized to area 82 whereby an electrodeposit 83, e.g., an Au desposit, is obtained thereon in a desired thickness. It is of course to be understood that there can occur plating on other areas of surface 80, but the plating achieved by contact masking anodes 62 by member 81 is non-uniform whereby area 82 is plated to a desired thickness at a much greater rate than that achieved, if at all, at those other areas. It is to be stressed, however, that the invention disclosed herein can achieve selective plating of discrete areas of a surface without plating adjacent areas, such plating being of a practical thickness, e.g., typically 100μ inches. It is to be noted hereat that the selective plating on area 82 is enhanced in selectivity and material properties by pulsing the current passing through. The pulsing can be accomplished using conventional techniques, including a programmable pulse plating process such as generally described in U.S. Pat. No. 3,886,053.

It is of course to be understood that the selective masking of anodes 62 by member 81, resulting in a dielectric outlet channel having a certain dimension, orientation and shape, as well as a certain dielectric-to-cathode distance is dependent on such plating parameters as electrolyte flow rate through outlet channel 79, the current density employed or desired, the distance between the anode and cathode, anode shapes, the electrolyte employed and current pulsing, which will affect the degree and/or configuration of the masking to attain a desired electroplated shaped, e.g., spots or stripes, and the desired thickness distribution of the electrodeposit over a particular area. In this regard, the above plating parameters and their interaction with one another are well known in the electroplating art and their interaction with the degree and type of masking to be employed for a particular application can easily be ascertained experimentally by one skilled in the art in view of the disclosure contained herein.

Figure 3:
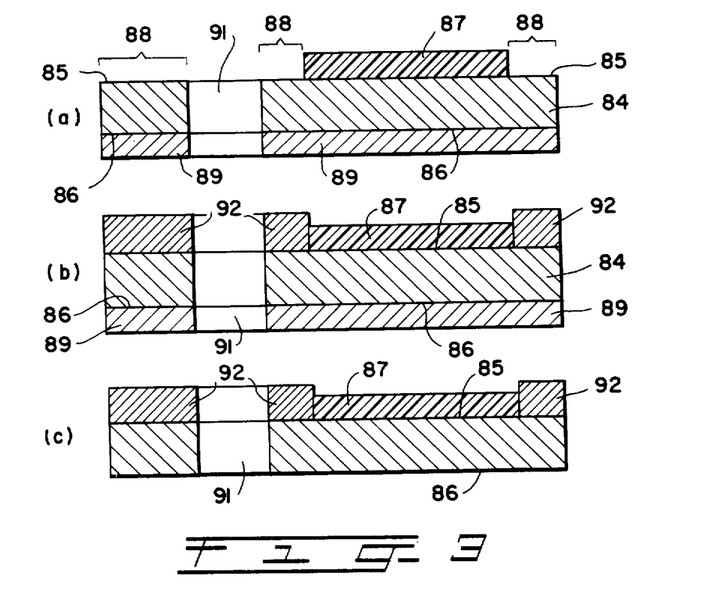
FIG. 3 is a cross-sectional view of an apertured substrate which is selectively electroplated.

The subject invention may also be employed with conventional plating techniques wherein masking of a desired substrate is employed. In this regard, reference is made to FIG. 3 where an apertured or foraminous substrate 84 is destined to be selectively electroplated on a first surface 85 and not on a second surface 86. The aperture or foramen is generally designated by the number 91. Heretofore, referring to FIG. 3(a), surface 85 was selectively masked with a first masking layer or pattern 87, e.g., a conventional photoresist patterned layer, to delineate exposed portions 88 of surface 85 destined to be electroplated. A second masking layer 89, e.g., a photoresist layer, is applied to surface 86 to prevent electrodeposition thereon. In FIG. 3 (b) substrate 84 is subjected to any conventional electroplating deposition whereby metal deposit 92 is deposited on portions 88 [FIG. 3(a)] of surface 85 without deposition on surface 86. The masking layers (87, 89) may then be stripped away using conventional techniques well known in the art.

The subject invention eliminates the need for masking layer 89 on surface 86. Referring to FIG. 3(c), only masking layer 87 is employed on surface 85 surface 86 is therefore exposed. Substrate 84 is then cathodically charged and treated with the system according to the invention such as illustrated in FIG. 1 and described above. Electrodeposition only occurs on areas 88 [FIG. 3(a)] of surface 85 to yield deposit 92. Although electroplating electrolyte (76 of FIG. 1) passes through aperture 91 [FIG. 3(c) ], masking member 81 (FIG. 1) creates electrolyte discontinuity along surface 86 whereby plating thereon does not occur at a fixed electrolyte flow and current density.

It is to be understood that the substrate to be electroplated and/or the electroplating system of the present invention can be movable, by any conventional means, whereby the system is not a static one. Thus, the selective electrodeposition described above may be used in a continuous plating process as well as in a step and repeat plating process (static). It is also to be understood that the electroplating system of the present invention can be employed to selectively electroplate a continuously moving substrate wherein pulsed current is used, such as described in U.S. Pat. No. 3,894,918, assigned to the assignee hereof, and incorporated by reference hereinto. Additionally, with respect to using pulsed current in such a manner, voltage ramping can be employed to insure a desired thickness profile of the resultant electrodeposit.

EXAMPLE I

Figure 4:
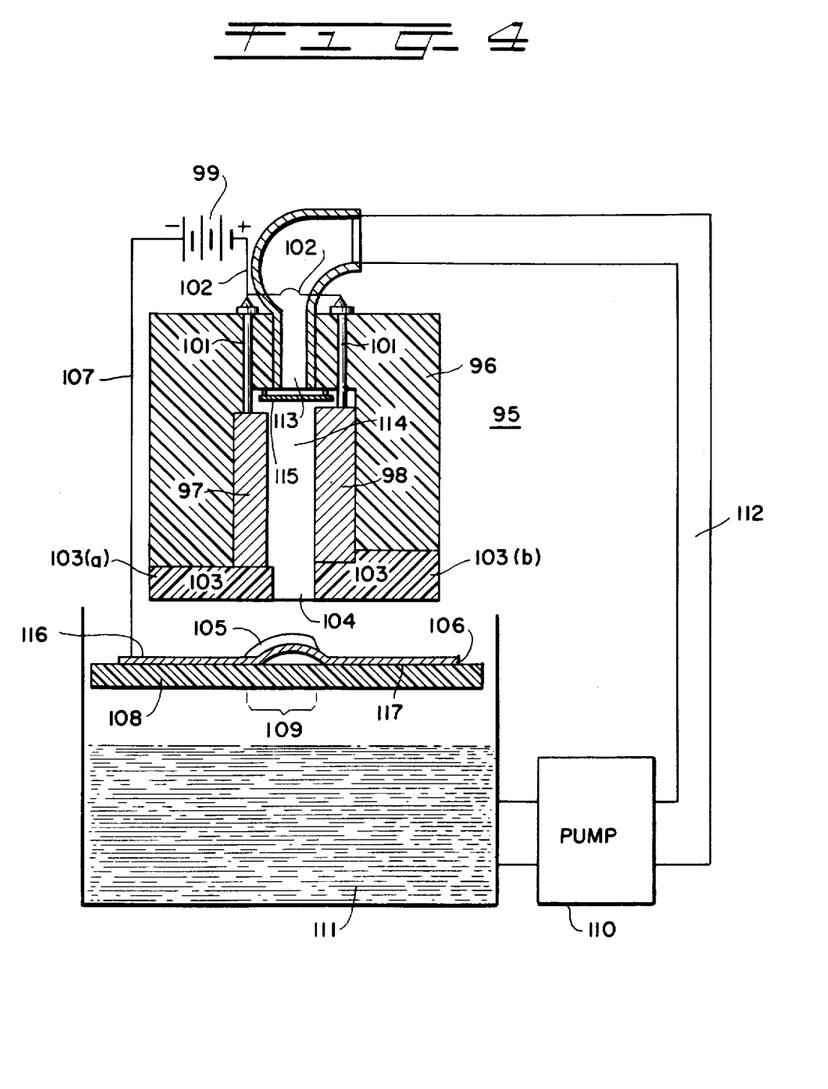
FIG. 4 is a schematic view of an electroplating system according to the invention.

Referring to FIG. 4, a plating system 95 was employed which comprised a polytetrafluoroethylene housing 96 which had supported therein a first rectangular plate anode 97 and a second rectangular plate anode 98, both of which comprised platinum and were 0.35 inch wide by about 2.8 inches long by 1.5 inches high. Both anodes 97 and 98 were connected to the positive side of a conventional constant voltage source 99, by means of conductive bolts 101 and conductors 102. Both anodes 97 and 98 were masked along their entire length by a polytetrafluoroethylene member 103, affixed to housing 96 by means of stainless steel bolts and nuts. Member 103 was rectangular in shape and had a width of 2.2 inches and a length of 3.82 inches with a rectangular aperture therein having dimensions of 2.82 inches long by 0.30 inch wide which comprised outlet channel 104. Anode 97 was thereby masked with portion 103(a) of member 103 having a thickness of 3/16 inch and anode 98 was masked with portion 103(b) of member 103 having a thickness of 5/16 inch. Housing 96 was situated whereby dielectric member 103 was about 1/32 of an inch above a nickel-plated copper connector 106 having a curved surface area. Connector 106 had apertures (not shown) therein which permitted electrolyte to pass therethrough. Connector 106 was connected to the negative side of constant voltage source 99 by means of conductor 107, and was supported on a polytetrafluoroethylene base 108.

Figure 2:
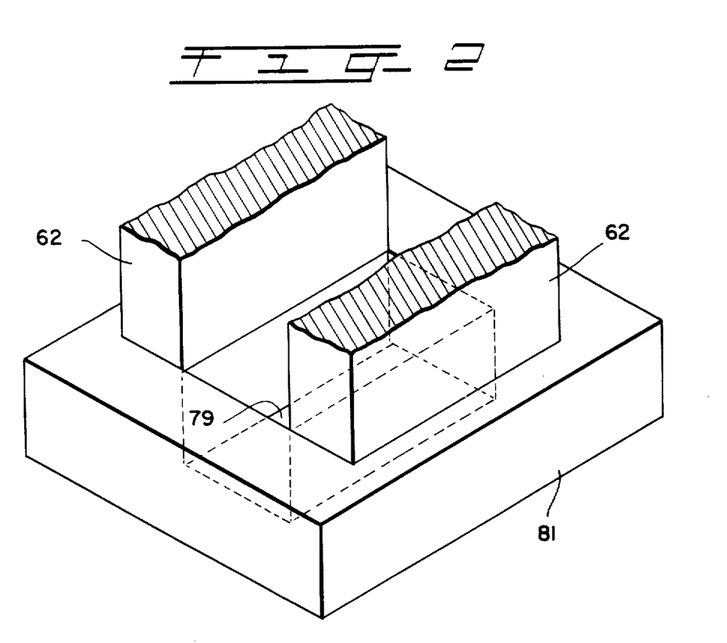
FIG. 2 is a partial isometric view of a masking member and anodes of FIG. 1.

The terminus of rectangular outlet channel 104, similar to that illustrated in FIG. 2 (outlet channel 79), formed by dielectric member 103, was angled counterclockwise about 6° with respect to the horizontal axis of connector 106. The dimensions of channel outlet 104 did not correspond to an area 109 of connector 106 desired to be plated which was a strip 0.24 inch wide by 2.82 inches long.

A conventional polypropylene centrifugal pump 110 was activated to produce a continuous flowing stream of electrolyte 111 which passed through a feed line 112, was injected through an inlet 113 onto a polytetrafluoroethylene flow distributor plate 115 into a channel 114 (2.82 inches long by 0.35 inch wide by 1.5 inches high) formed by the anodes 97 and 98. Flow distributor plate 115 insures uniform distribution of the stream of electrolyte 111 from circular inlet 113 through channel 114 to rectangular outlet channel 104. Electrolyte 111 comprised an aqueous solution comprising 32g/liter of solution of KAu(CN)$_2$ and 1000 parts per million of cobalt citrate. Forty-five grams per liter of solution of potassium dihydrogen phosphate and sufficient KOH and citric acid were added to make the density of the solution 18° Baume. Electrolyte 111 was maintained at all times at a pH of about 3.5 to 5.5 and a temperature of 65° C. to 75° C. The stream of electrolyte passed through channel 114, contacting anodes 97 and 98 which had a voltage of about 3 to 4 volts impressed thereon. The electrolyte stream then passed from outlet channel 104 at a rate of 425 ml/second and was distributed as a free flowing stream of electrolyte over the surface 116 of connector 106, including area 109 thereof. Connector 106 had been negatively charged to about 3 to 4 volts and was contacted by the electrolyte only from the free flowing stream. The stream of electrolyte which contacted anodes 97 and 98 and charged surface 116 became charged and a current was passed therethrough whereby a current density of 555A/ft.$^2$ was established therein. After about 15 seconds, a 100$\mu$ inch gold deposit 105 was electroplated only on area 109 of connector 106. There was no plating on surface 117 of connector 106 due to electrolyte discontinuity even though electrolyte passed through connector 106 via apertures (not shown).

EXAMPLE II

A. The procedure of Example I was repeated except that the current established within the electroplating electrolyte was pulsed, using a conventional technique, in a rectangular wave form having a 0.1 millisecond current on-time and a 1.0 millisecond off-time. The current density within the distributed free stream of electrolyte was 200 A/ft.$^2$. A 100$\mu$ inch gold deposit was obtained using 0.5 Amp-minute of total electricity. There was no plating on surface 117 of connector 106. The pulse plating improved the selectivity of the deposit.

B. The procedure of Example II-A was repeated at a current density of 5328A/ft.$^2$. Essentially the same results were obtained.

EXAMPLE III

Figure 5:
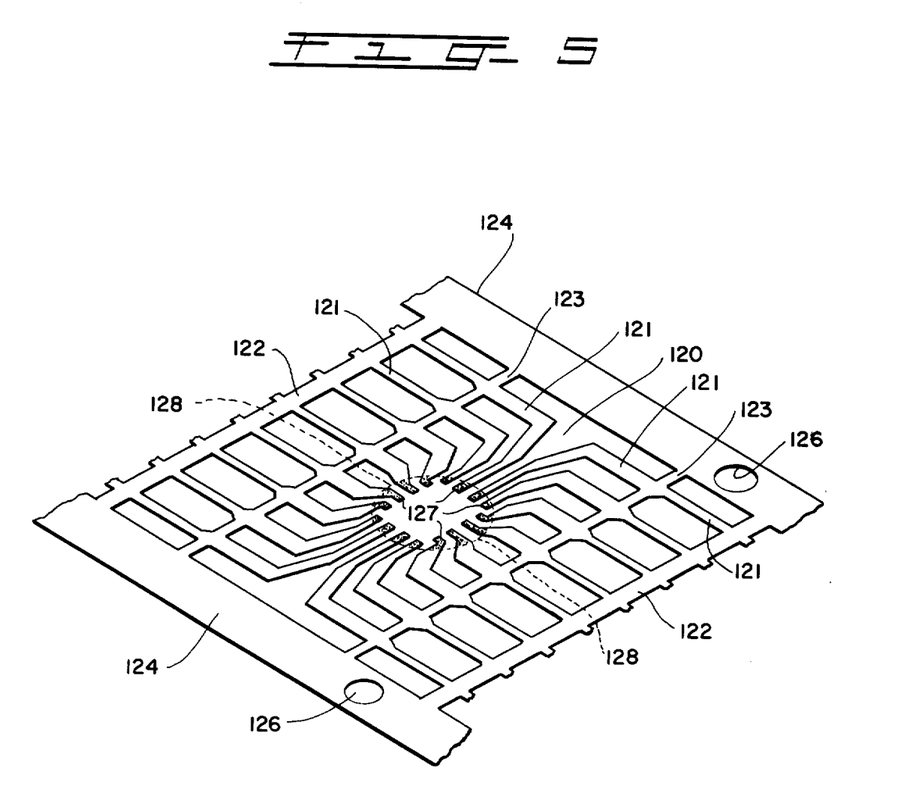
FIG. 5 is an isometric view of a first lead frame, showing a plurality of leads interconnected by perforated carrier strips and relatively narrow support strips, showing portions of the leads that have been electroplated in accordance with the present invention.

Referring to FIG. 5, there is shown a lead frame 120 destined for bonding to an integrated circuit chip and upon which selective electroplating thereupon was carried out. Frame 120 has a group of leads 121 which have outer ends interconnected to outer support strips 122 and which also have free ends. Leads 121 are also interconnected by relatively narrow, intermediate support strips 123. The ends of the support strips 122 and 123 are joined to carrier strips 124. Perforations 126 were formed in carrier strips 124 to enable frame 120 to be conveniently handled by and automatically fed into various treating facilities. Lead frame 120 was stamped from a copper sheet (with trace amounts of silver in the order of about 12 ozs. per ton) which was about 10 mils thick. The copper frame 120 was preplated with a nickel layer, about 15 to 30 microinches thick, to prevent the copper from diffusing into the gold layer destined to be electrodeposited thereon.

A spot layer 127 of gold was electroplated on the surface of each of the free ends of leads 121 of frame 120. These surfaces, considered as a group, have the configuration of a cicular area or a spot 128. Twelve frames 120 formed in a strip having an overall length of about 10 inches were gold plated to cover circular area 128 of two frames 120, having a 0.230 inch diameter, in the following manner.

Figure 6:
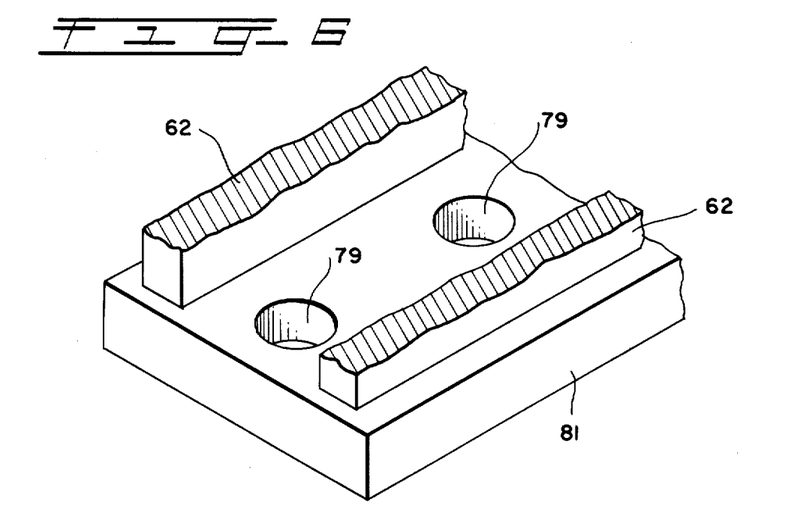
FIG. 6 is a partial isometric view of a masking member and anodes of FIG. 1.

The apparatus illustrated in FIG. 1 was employed using a polytetrafluoroethylene housing 61 having two platinum clad-titanium rectangular plate anodes 62 therein. Anodes 62 were ⅛ inch wide and had a length equal to that of the length of the strip comprising the twelve frames 120 (10 inches) and a height of 1 inch. Masking member 81 comprised a 0.20 inch thick polytetrafluoroethylene sheet which was 10 inches long by 3.6 inches wide and was affixed to housing 61 by means of stainless steel nuts and bolts and covered the entire length of each anode 62. As shown in FIG. 6, member 81 had two 0.20 inch diameter circular apertures therethrough which defined two outlet channels 79 each of whose central axes corresponded to the respective central axis of each of two adjacent spots 127 and were 0.83 inch apart. Dielectric member 81 was aligned and placed ⅛ inch above the strip comprising frames 120 (cathodically charged).

Referring back to FIG. 1, a polypropylene centrifugal pump 74 was activated to produce a continuous flowing stream of electrolyte 76 which comprised an aqueous solution comprising 32g/liter of solution of $KAu(CN)_2$, 0.8 parts per million lead cirtrate, and 50g/liter of solution of ammonium citrate. Sufficient KOH and ammonium sulfate were added to give a solution having a density of 18° Baume. The resultant solution was maintained at all times at a pH of 4 and a temperature of 65° C. The stream of electrolyte was injected through inlet 72 into channel 78 (10 inches long by 0.28 inch wide by 1 inch high) formed by anodes 62. The stream of electrolyte passed through channel 78, contacting anodes 62 (anodes 62 had a voltage of 3 to 4 volts impressed on them, by conventional constant voltage source 67). The stream of electrolyte was discharged from each outlet channel 79 (FIG. 6) at a rate of about 50 ml/second as a free flowing stream and was distributed over a wide area of the strip comprising the lead frames 120 (FIG. 5), including area 128 of the two frames 120 to be plated. The strip comprising the lead frames 120 had been negatively charged (3 to 4 volts). The stream of electrolyte which contacted anodes 62 and charged strip of lead frames 120 became charged and a current was passed therethrough whereby a current density of at least 500A/ft.$^2$ was established therein. A 100μ inch gold deposit was obtained after 5 seconds on each of the free ends of leads 121 of the two frames 120 being plated, whose surfaces, considered as a group, comprised spot 128 on each frame 120 (FIG. 5).

There was no plating on the underside of each lead frame 120 (FIG. 5) [plated and unplated], except at the free ends of leads 121, contained in the strip treated, even though electrolyte passed through the apertures contained therein. Mask member 81 (FIG. 1) controlled flow rate distribution whereby there was actual discontinuity of electrolyte on the underside of each lead frame, except at the free ends of plated leads 121, thereby preventing electrodeposition thereon.

EXAMPLE IV

The procedure of Example III was repeated except that six lead frames 120 (FIG. 5) were interconnected into a strip to be plated comprising six spots or areas 128 (FIG. 5) spaced 0.83 inch apart. The anodes were 10 inches long and the dielectric member employed to mask the anode along its entire length had a 0.20 inch diameter aperture for each area 128 (FIG. 5) in the strip thereby defining six circular outlet channels 0.83 inch apart from one another, center-to-center. Selective plating was again achieved as in Example II without the necessity of selectively masking the cathodically charged strip of six lead frames 120. Also plating was minimized on the underside of the strip comprising the plurality of lead frames 120.

EXAMPLE V

Figure 7:
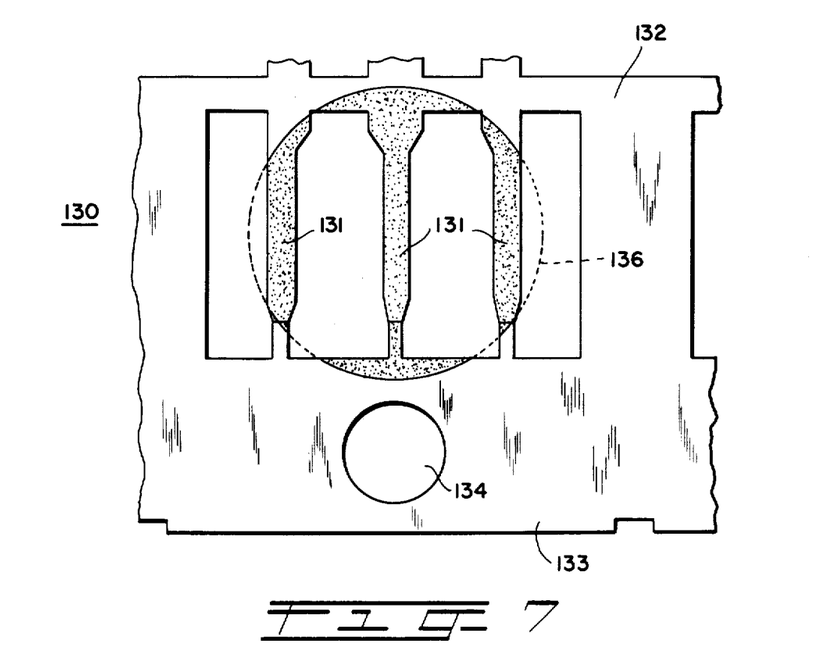
FIG. 7 is an isometric view of a second lead frame showing a plurality of leads and portions of the leads that have been electroplated in accordance with the present invention.

Referring to FIG. 7, there is shown a lead frame 130 upon which selective electroplating thereupon was carried out. Frame 130 has a group of leads 131 which are joined to carrier strips 132 and 133. Perforation 134 was formed in carrier strip 133 to enable frame 130 to be conveniently handled by and automatically fed into various treating facilities. Lead frame 130 was stamped from a nickel sheet which was about 10 mils thick.

A spot layer of gold was electroplated on the surface of each of leads 131 of frame 130. These surfaces, considered as a group, have the configuration of a circular area or a spot 136. Seven frames 130 formed in a strip, having a length of about 3 inches, were gold plated to cover circular area 136 having a 0.20 inch diameter in the manner described in EXAMPLE III above.

Referring to FIG. 1, the masking member 81 employed had seven rectangular outlet channels 79 which were each 0.08 inch wide by 0.28 inch long and had a center-to-center separation of 0.31 inch between adjoining channels 79. The dielectric member 81 masking anodes 62 was 0.125 inch thick by 2.8 inches long by 2.0 inches wide. Anode channel 78 had a width of 0.4 inch, and anodes 62 were 0.25 inch wide by 2.8 inches long by 1.0 inch high. Electroplating electrolyte 76 had a flow rate through outlet channels 79 of 166 ml/second and a current density of about 500A/ft.$^2$.

Masking member 81 (FIG. 1) was aligned with the strip comprising frames 130 whereby the central axis of each rectangular channel 79 corresponded to the respective central axis of each spot 136 (FIG. 7) with which it was aligned. Masking member 81, contact masking anodes 62, was then maintained ⅛ inch above the strip comprising the seven frames 130. A round area or spot 136 (FIG. 7) of 0.20 inch diameter was gold plated whereby leads 131 had a deposit of 100μ inches after 5 seconds.

EXAMPLE VI

Figure 8:
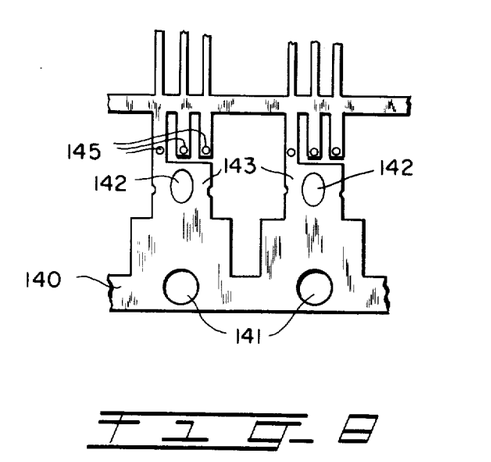
FIG. 8 is a partial isometric view of a portion of a lead frame that has been selectively electroplated in accordance with the present invention.

Referring to FIG. 8, there is shown a portion of a lead frame 140 upon which selective electroplating thereupon was carried out. Frame 140 was stamped from a copper sheet which was about 10 mils thick. Perforation 141 was formed in frame 140 to enable frame 140 to be conveniently handled by and automatically fed into various treating facilities. A discrete area 142 of frame 140 was gold electroplated. Area 142 was oval shaped and adjacent areas 143 were not apertured thereby preventing flowthrough of any electroplating electrolyte directed at area 142. Also discrete circular areas 145 were gold electroplated.

Fourteen frames 140, formed in a strip, having a length of about 6.875 inches, were gold plated to cover oval area 142 which was about 0.125 inch long by 0.093 inch wide, in the manner described in Example III above.

Figure 9:
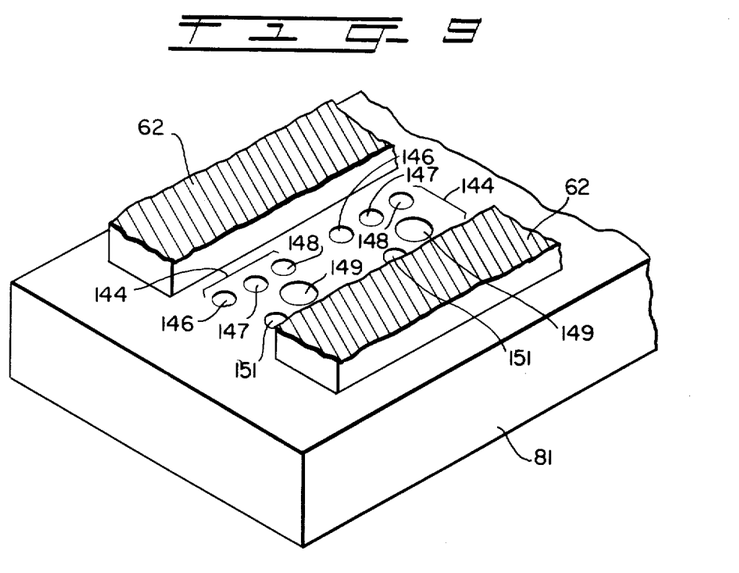
FIG. 9 is a partial isometric view of a masking member and anodes of FIG. 1.

Referring to FIG. 1, the masking member 81 employed had a set of outlet channels (fourteen) for each area 142. Referring to FIG. 9, each set of outlet channels 144 comprised five apertures 146, 147, 148, 149, and 151. Apertures 146, 147, and 148 were 0.040 inch in diameter and were spaced from one another 0.085 inch, center-to-center. Aperture 149 was 0.065 inch in diameter and was spaced 0.035 inch (center-to-center) to the right of aperture 147, and 0.117 inch (center-to-center) below aperture 147. Aperture 151 was 0.040 inch in diameter and spaced 0.050 inch (center-to-center) to the left of aperture 149 and 0.050 inch (center-to-center) below aperture 149. Adjacent apertures 149 were spaced 0.50 inch (center-to-center) from one another. The center of aperture 149 was spaced 0.40 inch from the horizontal axis (center line) of the dielectric member 81 and 0.35 inch from the vertical axis.

The dielectric member 81 masking anodes 62 was 0.25 inch thick by 1.5 inches wide by about 8.5 inches long. Anodes 62 were about 8.5 inches long by 0.50 inch wide by 0.50 inch high. The anode-to-anode separation was 0.50 inch.

Electroplating electrolyte 76 had a flow rate through each set 144 in excess of 133 ml/second and a current density between 500–1000 A/ft.$^2$.

Masking member 81 (FIG. 1) was aligned with the central axis of each area 142 (FIG. 8) whereby the central axis of each set 144 (FIG. 9) corresponded thereto. Masking member 81, contact masking anodes 62, was then maintained ⅛ inch above the strip comprising the fourteen frames 140. An oval deposit of 100μ inches corresponding to area 142 (FIG. 8) was obtained by contact of electrolyte passing through apertures 149 and 151. A circular deposit of 100μ inches corresponding to area 145 was obtained by contact of electrolyte from apertures 146, 147, and 148.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of selectively electroplating an area of a surface, which comprises:
   a. cathodically charging the surface and initially maintaining said charged surface out of contact with an electroplating electrolyte;
   b. contact masking a charged anode, spaced from said maintained charged surface, with a dielectric member which is maintained between said anode and the surface, along their corresponding opposed surface areas, out of contact with the surface;
   c. contacting said masked anode with a stream of electroplating electrolyte; and
   d. distributing said electrolyte stream over at least a portion of the surface, said portion including the area to be electroplated, to freely flow a stream of electrolyte thereover, to selectively electroplate the area.

2. A method of selectively plating an area of a substrate surface, which comprises:
   a. contact masking at least one charged anode, electrode, spaced from the surface, with a dielectric member which is maintained between said anode and the surface, along their corresponding opposed surface areas, out of contact with the surface;
   b. cathodically charging the surface;
   c. contacting said masked anode electrode with a stream of an electroplating electrolyte; and
   d. contacting at least a portion of said charged surface with electrolyte only from said electrolyte stream to distribute said electrolyte over at least said portion of the surface, said portion including the area to be plated, to freely flow electrolyte thereover to selectively electroplate the area.

3. The method as defined in claim 2 wherein:
   in step (a) said stream of electrolyte passes through a channel defined at least by said dielectric member.

4. A method of selectively plating an area of a substrate surface, which comprises:
   a. charging an anode spaced from the surface to a first potential;
   b. cathodically charging the surface to a second potential;
   c. contacting said charged anode and said charged surface with a stream of an electroplating electrolyte to charge said electrolyte to pass an electric current within said eletrolyte and to distribute said stream of charged electrolyte over at least a portion of the surface including the area to form a free flowing stream of charged electrolyte thereover; and
   d. contact masking said anode with a dielectric member maintained between said anode and said charged surface, along their commonly opposed surface areas, out of contact with said charged surface, to control the lines of force of said current between said anode and said charged surface and to control the flow rate distribution of said free flowing stream of charged electrolyte across said charged surface to selectively electroplate the area.

5. The method as defined in claim 4 wherein said dielectric member additionally affects electrolyte discontinuity of said free flowing stream of electrolyte to selectively plate the area.

6. The method as defined in claim 4 which further comprises pulsing said current passing within said electrolyte.

7. The method as defined in claim 4 wherein:
   in step (c) said stream of electrolyte passes through a channel defined at least by said dielectric member.

8. In an improved method of plating a metal pattern on a first surface of an electrically conductive foraminous substrate, comprising:
   a. selectively masking the first surface with a masking medium to delineate an exposed first surface pattern corresponding to the metal pattern;
   b. masking a second surface of the substrate with a masking medium to prevent metal deposition thereon, said second surface being opposite the first surface; and
   c. electroplating a metal deposit on said pattern, wherein the improvement comprises:
   elimating step (b) above by:
   a$^1$. electrically charging an anode;
   b$^1$. cathodically charging the first surface pattern;
   c$^1$. contacting said charged anode and said charged first surface pattern with a stream of an electroplating electrolyte to charge said electrolyte to pass an electric current therewithin and to distribute said stream of charged electrolyte over said charged first surface pattern; and
   d. contact masking said charged anode with a dielectric member maintained between said charged anode and said charged first surface pattern, along their corresponding opposed surfaces, out of contact with said charged first surface, to establish electrolyte discontinuity across said second surface to prevent electrodeposition thereon.

* * * * *